(12) United States Patent
Medhat et al.

(10) Patent No.: US 8,497,619 B2
(45) Date of Patent: Jul. 30, 2013

(54) LONG RANGE TRAVEL MEMS ACTUATOR

(75) Inventors: Mostafa Medhat, Heliopolis Cairo (EG); Yasseen Nada, Heliopolis Cairo (EG); Bassem Mortada, Nasr (EG); Bassam A. Saadany, Nasr (EG)

(73) Assignee: Si-Ware Systems, Cairo (EG)

( * ) Notice: Subject to any disclaimer, the term of this patent is extended or adjusted under 35 U.S.C. 154(b) by 498 days.

(21) Appl. No.: 12/761,621

(22) Filed: Apr. 16, 2010

(65) Prior Publication Data

US 2010/0264777 A1 Oct. 21, 2010

Related U.S. Application Data

(60) Provisional application No. 61/170,542, filed on Apr. 17, 2009.

(51) Int. Cl.
*H02N 1/00* (2006.01)
*H01L 41/04* (2006.01)

(52) U.S. Cl.
USPC .......................... 310/309; 310/308; 318/116

(58) Field of Classification Search
USPC ............. 310/300, 308, 309; 318/116; 385/18; 361/283.1
See application file for complete search history.

(56) References Cited

U.S. PATENT DOCUMENTS

| 5,025,346 | A | 6/1991 | Tang |
| 5,983,721 | A | 11/1999 | Sulzberger |
| 5,998,906 | A | 12/1999 | Jerman et al. |
| 6,175,170 | B1 | 1/2001 | Kota |
| 6,384,510 | B1 | 5/2002 | Grade et al. |
| 6,771,001 | B2 | 8/2004 | Mao et al. |
| 2003/0102936 | A1 | 6/2003 | Schaefer |
| 2007/0267939 | A1* | 11/2007 | Borovic et al. ............... 310/309 |

FOREIGN PATENT DOCUMENTS

WO    WO 2007147241 A2 * 12/2007

OTHER PUBLICATIONS

International Search Report and Written Opinion for PCT/US2010/031380 dated May 4, 2011 (9 pages).
W. Huang and G. Lu, "Analysis of Lateral Instability of In-Plane Comb Drive MEMS Actuators Based on a Two-Dimensional Model," Sensors and Actuators A 113, pp. 78-85, May 5, 2004.
B. Borovic, F. L. Lewis, A. Q. Liu, E. S. Kolesar and D. Popa, "The Lateral Instability Problem in Electrostatic Comb Drive Actuators: Modeling and Feedback Control," Journal of Micromechanics and Microengineering 16, pp. 1233-1241, May 11, 2006.

(Continued)

*Primary Examiner* — Tran Nguyen
*Assistant Examiner* — Jose Gonzalez Quinones
(74) *Attorney, Agent, or Firm* — Garlick & Markison; Holly L Rudnick

(57) ABSTRACT

An electrostatic comb drive actuator for a MEMS device includes a flexure spring assembly and first and second comb drive assemblies, each coupled to the flexure spring assembly on opposing sides thereof. Each of the first and second comb assemblies includes fixed comb drive fingers and moveable comb drive fingers coupled to the flexure spring assembly and extending towards the fixed comb drive fingers. The comb drive fingers are divided equally between the first and second comb drive assemblies and placed symmetrically about a symmetry axis of the flexure spring assembly. When electrically energized, the moveable comb drive fingers of both the first and second comb drive assemblies simultaneously move towards the fixed comb drive fingers of the first and second comb drive assemblies.

24 Claims, 11 Drawing Sheets

OTHER PUBLICATIONS

G. Zhou and P. Dowd, "Tilted Folded-Beam Suspension for Extending the Stable Travel Range of Comb-Drive Actuators," Journal of Micromechanics and Microengineering 13, pp. 178-183, Dec. 24, 2002.

J. D. Grade, H. Jerman and T. W. Kenny, "Design of Large Deflection Electrostatic Actuators," Journal of Microelectromechanical Systems, pp. 1-10, 2001.

M. T. Hou, G. K. Huang, J. Huang, K. Liao, R. Chen and J. A. Yeh, "Extending Displacements of Comb Drive Actuators by Adding Secondary Comb Electrodes,", Journal of Micromechanics and Microengineering 16, pp. 684-691, 2006.

C. Chen and C. Lee, "Design and Modeling for Comb Drive Actuator with Enlarged Static Displacement,", Sensors and Actuators A 115, pp. 530-539, Apr. 17, 2004.

J. Chiou, Y. Lin and C. Kuo, "Extending the Traveling Range with a Cascade Electrostatic Comb-Drive Actuator," Journal of Micromechanics and Microengineering 18, pp. 1-8, Dec. 3, 2007.

W. C. Tang, T. H. Nguyen and R. T. Howe, "Laterally Driven Polysilicon Resonant Microstructures," Proc. IEEE Workshop on Microelectromech. Syst., Salt Lake City, UT, pp. 53-59, Feb. 1989.

N. Lobontiu and E. Garcia, "Analytical Model of Displacement Amplification and Stiffness Optimization for a Class of Flexure-Based Compliant Mechanisms," Computers and Structures 81, pp. 2797-2810, Jul. 24, 2003.

* cited by examiner

LONG RANGE TRAVEL MEMS ACTUATOR

CROSS REFERENCE TO RELATED PATENTS

This U.S. application for patent claims the benefit of the filing date of U.S. Provisional Patent Application entitled, Long Travel Range MEMS Actuator, having Ser. No. 61/170,542, filed on Apr. 17, 2009, which is incorporated herein by reference for all purposes.

BACKGROUND OF THE INVENTION

1. Technical Field of the Invention

The present invention relates in general to Micro Electro-Mechanical Systems (MEMS) devices and in particular, to MEMS actuators.

2. Description of Related Art

Micro Electro-Mechanical Systems (MEMS) refers to the integration of mechanical elements, sensors, actuators and electronics on a common silicon substrate through microfabrication technology. For example, the microelectronics are typically fabricated using an integrated circuit (IC) process, while the micromechanical components are fabricated using compatible micromachining processes that selectively etch away parts of the silicon wafer or add new structural layers to form the mechanical and electromechanical components. MEMS devices are attractive candidates for use in spectroscopy, profilometry, environmental sensing, refractive index measurements (or material recognition), as well as several other sensor applications, due to their low cost, batch processing ability and compatibility with standard microelectronics. In addition, the small size of MEMS devices enables the integration of equipment incorporating MEMS devices into mobile and hand held devices.

Reliable actuators are critical components for MEMS devices. The two most common types of MEMS actuators are thermal actuators and electrostatic actuators. One example of an electrostatic actuator is a comb-drive actuator. Comb-drives are linear motors that utilize electrostatic forces acting between two metal or silicon combs to cause motion of a MEMS component, such as a micromirror. The electrostatic forces are created when a voltage is applied between the combs causing them to attract. One comb is typically fixed, while the other comb is moveable. Each comb includes a plurality of comb fingers arranged so that the moveable comb fingers slide past the fixed comb fingers until they are interdigitated. A restoring spring returns the moveable comb to its original position when a voltage is no longer present between the combs. The force available from each finger is relatively small, and therefore, comb-drive actuators typically have between 10 and 200 fingers to produce adequate force for a MEMS device.

However, the stable travel range of the comb-drive actuator is limited by electromechanical side instability. When side instability occurs, the movable comb fingers are displaced perpendicular to the direction of motion and come into contact with the fixed comb fingers. As the moveable comb moves toward the fixed comb, the overlap area between the fingers increases and the cross-axis force becomes greater, which causes the fingers to suddenly snap over the sideway. This is attributed to two effects: the displacement in the direction perpendicular to the direction of motion and the induced moment around the center of the restoring spring.

The stable travel range of electrostatic comb-drive actuators depends primarily on finger gap spacing, initial finger overlapping and spring stiffness of suspended springs. Increasing finger gap spacing of an electrostatic comb-drive actuator is the simplest method for increasing the stable travel range. However, this method requires a high driving voltage, which is undesirable in numerous applications.

Several other approaches have been proposed to extend the stable travel range. For example, one approach uses tilted folded-beam suspended springs instead of straight springs to shift the spring constant in the y direction. The corresponding spring constant in the y-direction changes from:

$$\frac{200EI}{3x^2 L} \quad \text{(Equation 1)}$$

to $$\frac{600EI}{(3x-5d)^2 L}, \quad \text{(Equation 2)}$$

where E is Young's modulus, I is the inertia moment of the mechanical spring, d is the projection of the suspended beam length along the x-direction and L is the suspended beam length.

Another approach to extend the stable traveling range includes adjusting the length of the individual comb fingers and utilizing pre-bent suspended springs. More recently, another approach utilizes a second comb electrode to extend the stable traveling range. This approach shifted Ke (the electrostatic negative spring constant) to extend the displacement of the electrostatic comb-drive actuator. Although each of the above approaches can potentially extend the stable traveling range, extra driving voltage is required to achieve this.

SUMMARY OF THE INVENTION

Embodiments of the present invention provide an electrostatic comb drive actuator for a Micro Electro-Mechanical System (MEMS) device with reduced side instability. The comb drive actuator includes a flexure spring assembly and first and second comb drive assemblies, each coupled to the flexure spring assembly on opposing sides thereof. Each of the first and second comb assemblies includes a fixed comb drive member having an elongate member with comb drive fingers extending from one side thereof and a moveable comb drive member having a center beam coupled to the flexure spring assembly and comb drive fingers extending from one side of the center beam towards the comb drive fingers of the fixed comb drive member.

The moveable comb drive member is moveable between a first position in which the comb drive fingers of the moveable comb drive member and the fixed comb drive member are partially overlapped and a second position in which the comb drive fingers of the moveable comb drive member and the fixed comb drive member are interdigitated to cause a displacement of the flexure spring assembly. In addition, the comb drive fingers are divided equally between the first and second comb drive assemblies and placed symmetrically about a symmetry axis of the flexure spring assembly perpendicular to a direction of motion of the moveable comb drive member. Furthermore, when electrically energized, the first and second comb drive assemblies contribute electrostatic force in the same direction of motion such that the comb drive fingers of the moveable comb drive members of both the first and second comb drive assemblies simultaneously move towards the comb drive fingers of the respective fixed comb drive members of the first and second comb drive assemblies.

In a further embodiment, a bi-directional electrostatic comb-drive actuator is provided that effectively doubles the travel range of the actuator while maintaining side stability. In the bi-directional comb-drive actuator, each of the first and second comb drive assemblies further includes first and second fixed comb drive members, in which each of the first and second fixed comb drive members has a respective elongate member with respective comb drive fingers extending from one side thereof, and a moveable comb drive member that includes two sets of comb drive fingers extending in opposite directions from the center beam towards the comb drive fingers of each of the first and second fixed comb drive members. The moveable comb drive member is moveable between the first position in which the comb drive fingers of the moveable comb drive member, the first comb drive member and the second comb drive member are partially overlapped, the second position in which the comb drive fingers of the first fixed comb drive member and one of the sets of the moveable comb drive member are interdigitated and a third position in which the comb drive fingers of the second fixed comb drive member and the other of the sets of the moveable comb drive member are interdigitated Embodiments of the present invention further provide a displacement multiplier for use within a Micro Electro-Mechanical System (MEMS) device that can increase the travel range of the electrostatic comb-drive actuator by an order of magnitude. The displacement multiplier includes a pair of springs symmetrical about a central axis of the displacement multiplier parallel to a direction of a force applied to the displacement multiplier, in which each of the springs is stiff in the direction of the force and compliant in a direction perpendicular to the direction of the force. The displacement multiplier further includes a pair of angled beam members symmetrical about the central axis and each having a first end coupled to a corresponding one of the pair of springs, a pair of pivots symmetrical about the central axis and each coupled to a corresponding one of the pair of angled beam members at a respective pivot point to allow rotation of the pair of angled beam members in response to motion of the pair of springs, a first pair of hinges symmetrical about the central axis and each coupled to a second end of a corresponding one of the pair of angled beam members, a pair of rigid body members symmetrical about the central axis and each having a first end coupled to a corresponding one of the first pair of hinges and a second pair of hinges symmetrical about the central axis and each coupled to a second end of a corresponding one of the pair of rigid body members. The first and second pairs of hinges allow rotation of the pair of rigid body members in response to motion of the pair of springs.

In exemplary embodiments, each of the springs is a compliant structure forming a U-shaped beam, each of the pivots is a compliant structure forming a cantilever beam and each of the hinges is a compliant structure forming an S-shape beam.

In further exemplary embodiments, corresponding ones of the first and second pair of hinges and the corresponding rigid body member therebetween form respective rotational joint systems in which motion in a direction perpendicular to the direction of motion of the electrostatic comb-drive actuator is magnified and transformed to a direction of motion of a MEMS element coupled between the second pair of hinges. In addition, corresponding ones of the pair of springs, the pair of pivots and the pair of angled beam members form respective lever systems, and the lever systems and the rotational joint systems are placed symmetrically around the symmetrical axis to transform rotation motion into translational motion corresponding to the direction of motion of the MEMS element.

Embodiments of the present invention further provide a MEMS device that includes the electrostatic comb-drive actuator with improved side stability, displacement multiplier and a MEMS moveable element coupled to the displacement multiplier. The force applied by the electrostatic comb-drive actuator on the displacement multiplier causes an amplified displacement of the MEMS moveable element with respect to the displacement of the flexure spring assembly of the comb-drive actuator. In further embodiments, at least one additional electrostatic comb-drive actuator is coupled to the displacement multiplier to provide improved actuator stability, therefore increasing the total travel range, while decreasing the driving voltage.

BRIEF DESCRIPTION OF THE DRAWINGS

A more complete understanding of the present invention may be obtained by reference to the following detailed description when taken in conjunction with the accompanying drawings wherein.

DETAILED DESCRIPTION OF THE DRAWINGS

In accordance with embodiments of the present invention, an architecture is described for an electrostatic comb-drive actuator that utilizes balanced fingers to increase the stable range in which the actuator can operate with no sticking. In addition, a displacement multiplier architecture is also described for use with a MEMS actuator to increase the displacement of the MEMS actuator by an order of magnitude.

Figure 1:
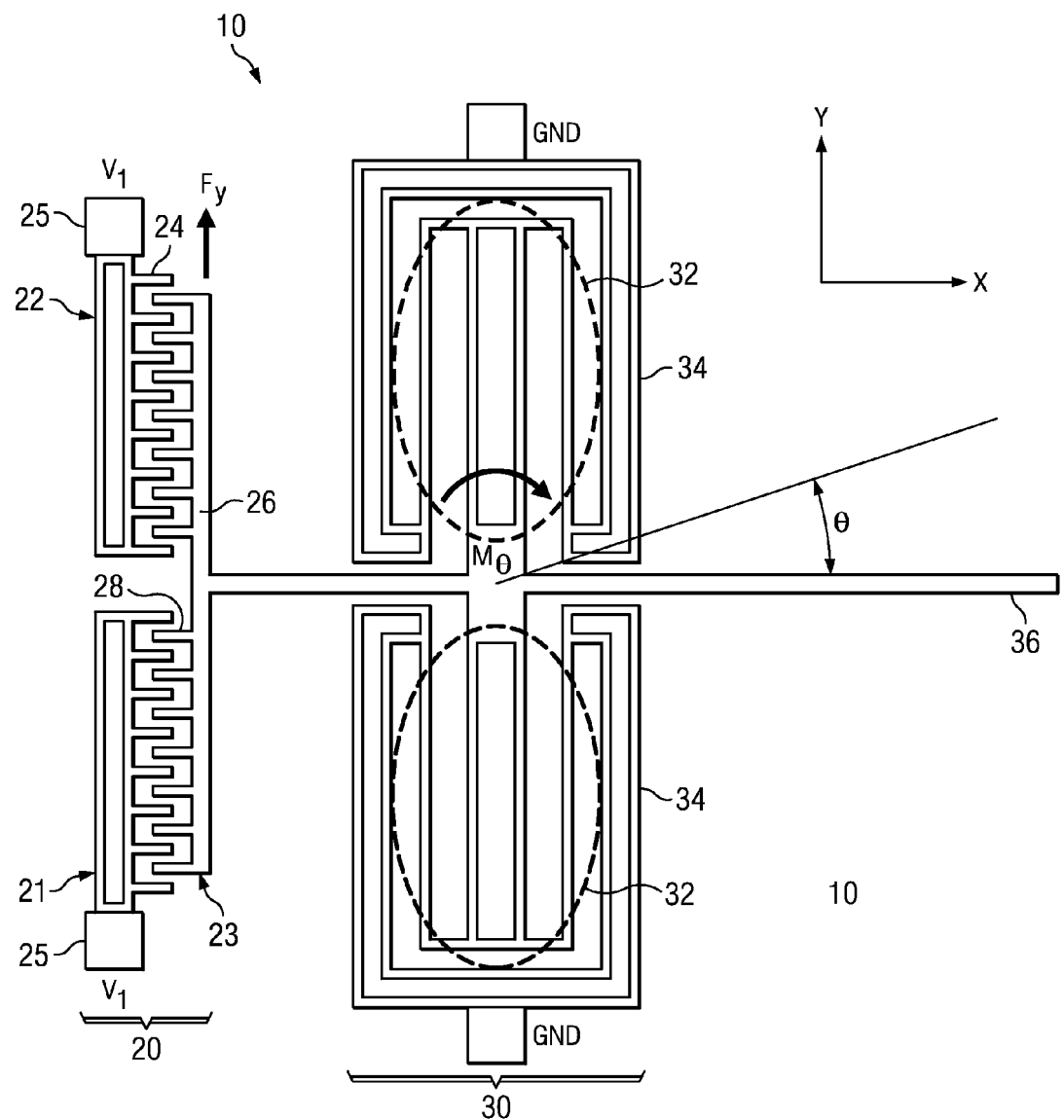
FIG. 1 is plan view illustrating a prior art electrostatic comb-drive MEMS actuator.

FIG. 1 illustrates a conventional electrostatic comb-drive actuator 10 for MEMS application. The actuator 10 includes a comb drive assembly 20 and a flexure spring assembly 30. The comb drive assembly 20 includes a fixed comb drive member 21 and a moveable comb drive member 23. Each of the fixed and moveable comb drive members 21 and 23 includes an elongate beam member 22 and 26, respectively, each having comb drive fingers 24 and 28, respectively, extending from one side thereof. The comb drive fingers 24 and 28 are arranged to slide past one another so as to become interdigitated in response to a voltage being applied across the fixed and moveable comb drive members 21 and 23 via electrodes 25. For example, by applying a driving voltage between the moveable comb drive fingers 28 and the fixed comb drive fingers 24, a displacement of the moveable comb drive fingers 28 toward the fixed comb drive fingers 24 is generated by the attractive electrostatic force.

The flexure spring assembly 30 includes springs 32, anchors 34 and a rotor 36. The rotor 36 is attached to the elongate member 26 of the moveable comb drive member 23. Springs 32 are coupled to the rotor 36 to enable linear motion of the rotor 36 as a result of the electrostatic force produced by the comb drive assembly 20. For example, when a voltage is applied to the comb drive assembly 20, the moveable comb drive member 23 moves from a first position in which the moveable comb drive fingers 28 and the fixed comb drive fingers 24 are partially overlapped to a second position in which the moveable comb drive fingers 28 and the fixed comb drive fingers 24 are interdigitated to cause a linear displacement of the rotor 36 in the direction of motion. Anchors 34 secure the springs 32 to a substrate (not shown) and enable the rotor 36 to spring back to an initial position when a voltage is no longer present across the comb drive members 21 and 23.

However, the maximum distance traveled by the rotor 36 is constricted by side instability that causes the comb drive fingers 24 and 28 to snap together due to a force unbalance resulting from a large electrostatic force with respect to a spring mechanical restoring force perpendicular to the direction of motion. In theory, the electrostatic forces at both comb drive members 21 and 23 should be equal, thus enabling each of the moveable comb drive fingers 28 to traverse along a respective central axis between two fixed comb drive fingers 24 without snapping. However, in practice, any misalignment in lithography process, etching process or any environmental disturbance could displace the moveable comb drive fingers 28 away from the central position between fixed comb drive fingers 24. Thus, the electrostatic forces at both comb drive members may be unequal. Accordingly, if the spring constant in the perpendicular direction cannot sustain the moveable comb drive fingers 28 at a steady position between two fixed comb drive fingers 24, the moveable comb drive fingers will snap to one side of the fixed comb drive fingers 24, and the rotor will not be able to cover more distance.

For example, as shown in FIG. 1, the direction of motion is the x-direction, and the force resulting from the instability is $F_y$. If the force $F_y$ is large enough, the rotor 36 will move in the y-direction towards one of the fixed fingers 24, depending on the sign of $F_y$. This will in turn result in a moment $M_\theta$ around the center of the flexure spring assembly 30. Thus, at the onset of instability, there are two effects coupled together: the translation in the direction perpendicular to the motion and the moment around the Z-axis $M_\theta$.

Figure 2:
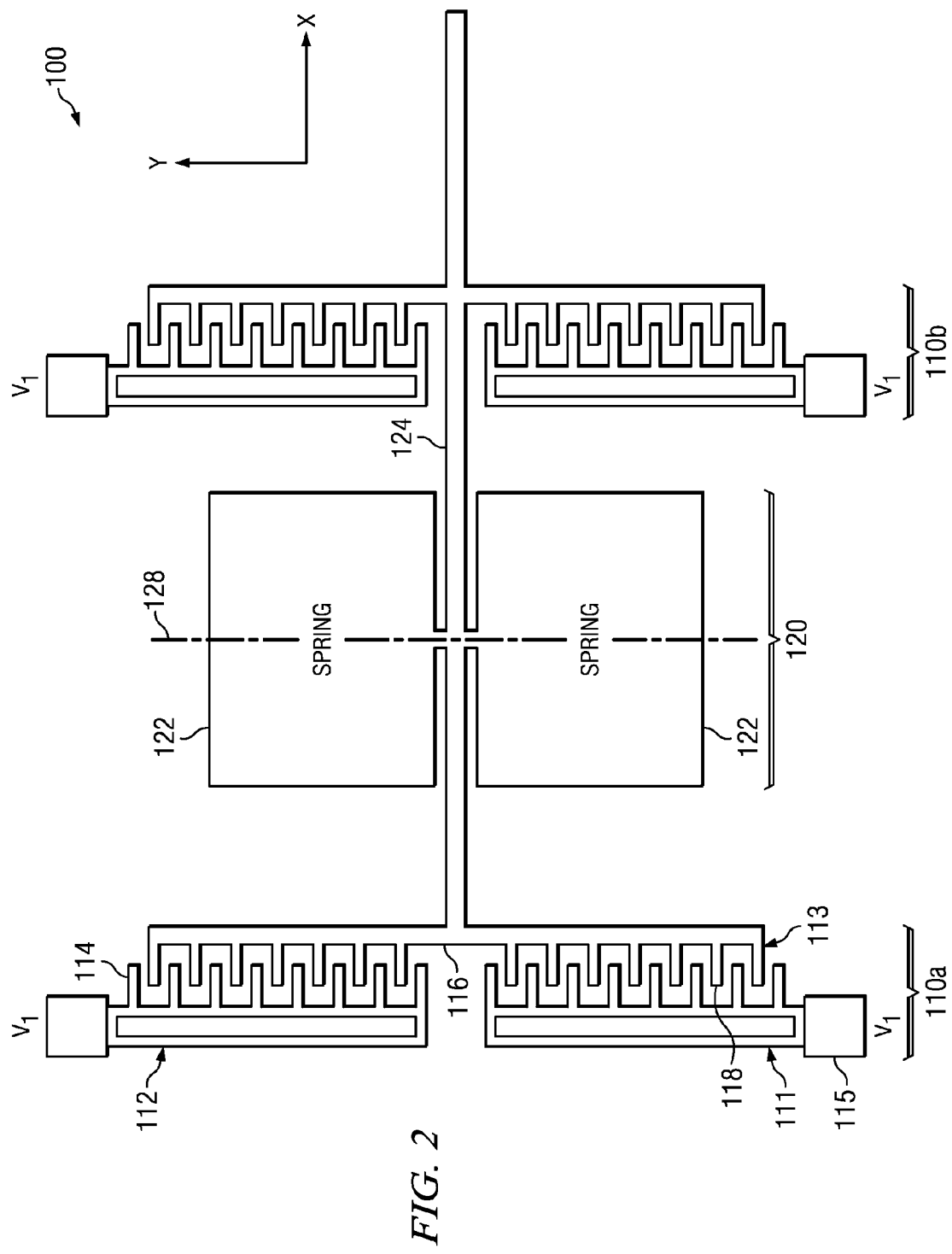
FIG. 2 is a plan view illustrating an exemplary electrostatic comb-drive MEMS actuator in accordance with embodiments of the present invention.

In accordance with embodiments of the present invention, as shown in FIG. 2, an electrostatic comb-drive actuator 100 is shown that provides reduced side instability. The electrostatic comb-drive actuator 100 includes two comb drive assemblies 110a and 110b symmetrically placed about a flexure spring assembly 120.

Each comb drive assembly 110a and 110b includes a respective fixed comb drive member 111 coupled to an underlying substrate (not shown) and a respective moveable comb drive member 113. Each of the fixed and moveable comb drive members 111 and 113 includes a respective elongate beam member 112 and 116, each having respective comb drive fingers 114 and 118 extending from one side thereof.

The comb drive fingers 114 and 118 are arranged to slide past one another so as to become interdigitated in response to a voltage being applied across the fixed and moveable comb drive members 111 and 113 via electrodes 115.

The comb drive fingers 114 and 118 are divided equally between the first and second comb drive assemblies 110a and 110b and placed symmetrically about a symmetry axis 128 in the Y-direction of the flexure spring assembly 120 perpendicular to a direction of motion of the moveable comb drive members 113 in the X-direction. Thus, half of the comb drive fingers 114 and 118 are placed to the left of the flexure spring assembly 120 and the other half of the comb drive fingers 114 and 118 are placed to the right of the flexure spring assembly 120 in a balanced manner The flexure spring assembly 120 includes springs 122 and a rotor 124. The rotor 124 is attached to the elongate member 116 of each of the moveable comb drive members 113 of the first and second comb drive assemblies 110a and 110b. Therefore, when electrically energized, the first and second comb drive assemblies 110a and 110b contribute electrostatic force in the same direction of motion such that the moveable comb drive fingers 118 of both the first and second comb drive assemblies 110a and 110b simultaneously move towards the respective fixed comb drive fingers 114 of the first and second comb drive assemblies 110a and 110b. For example, the moveable comb drive member 113 of each comb drive assembly 110a and 110b is moveable between a first position in which the comb drive fingers 114 and 118 of the fixed comb drive member 111 and the moveable comb drive member 113 are partially overlapped and a second position in which the comb drive fingers 114 and 118 of the fixed comb drive member 111 and the moveable comb drive member 113 are interdigitated to cause a displacement of the rotor 124.

Springs 122 are coupled to the rotor 124 to enable the linear motion of the rotor 124 in response to the electrostatic forces produced by each of the comb drive assemblies 110a and 110b. In addition, the springs 122 enable the rotor 124 to spring back to an initial position when a voltage is no longer present across the comb drive assemblies 110a and 110b. Although not shown, anchors secure the springs 122 to the substrate.

Figure 3:
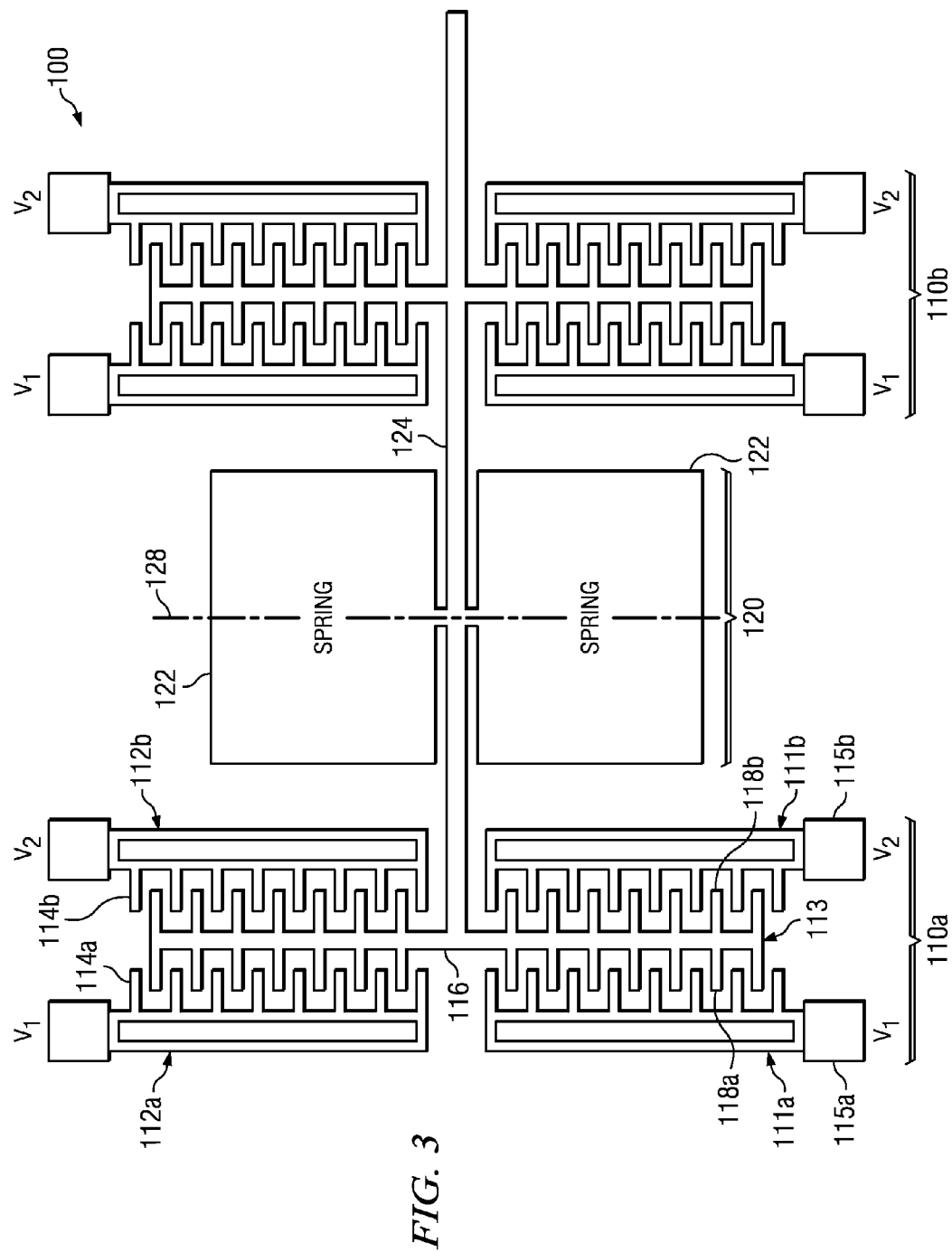
FIG. 3 is a plan view illustrating another exemplary electrostatic comb-drive MEMS actuator in accordance with embodiments of the present invention.

FIG. 3 illustrates another exemplary electrostatic comb-drive actuator 100 in accordance with embodiments of the present invention. The electrostatic comb-drive actuator 100 shown in FIG. 3 is a bi-directional comb-drive actuator in a push-pull configuration that effectively doubles the travel range of the actuator. The bi-directional electrostatic comb-drive actuator 100 includes first and second comb drive assemblies 110a and 110b and flexure spring assembly 120. Each of the first and second comb drive assemblies 110a and 110b includes first and second fixed comb drive members 111a and 111b coupled to an underlying substrate (not shown) and a moveable comb drive member 113.

Each of the first and second comb drive members 111a and 111b has a respective elongate member 112a and 112b with respective comb drive fingers 114a and 114b extending from one side thereof in a juxtapositional manner. The moveable comb drive member 113 includes two sets of comb drive fingers 118a and 118b extending in opposite directions from a center beam 116 towards respective comb drive fingers 118a and 118b of each of the first and second fixed comb drive members 111a and 111b.

Comb drive fingers 114a and 118a are each arranged to slide past one another so as to become interdigitated in response to a voltage being applied across the first fixed comb drive member 111a and the moveable comb drive member 113 via electrodes 115a. In addition, comb drive fingers 114b and 118b are each arranged to slide past one another so as to become interdigitated in response to a voltage being applied across the second fixed comb drive member 111b and the moveable comb drive member 113 via electrodes 115b. For example, the moveable comb drive member 113 is moveable between a first position in which the comb drive fingers 118a and 118b of the moveable comb drive member 113 are partially overlapped with the comb drive fingers 114a and 114b of the first and second fixed comb drive members 111a and 111b, respectively, a second position in which the comb drive fingers 114a of the first fixed comb drive member 111a and the comb drive fingers 118a of the moveable comb drive member 113 are interdigitated and a third position in which the comb drive fingers 114b of the second fixed comb drive member 111b and the comb drive fingers 118b of the moveable comb drive member 113 are interdigitated.

As in FIG. 2, the comb drive fingers 114a, 114b, 118a and 118b are divided equally between the first and second comb drive assemblies 110a and 110b and placed symmetrically about the symmetry axis 128 of the flexure spring assembly 120 perpendicular to a direction of motion of the moveable comb drive members 113. Thus, half of the comb drive fingers 114a, 114b, 118a and 118b are placed to the left of the flexure spring assembly 120 and the other half of the comb drive fingers 114a, 114b, 118a and 118b are placed to the right of the flexure spring assembly 120 in a balanced manner The flexure spring assembly 120 also includes springs 122 and the rotor 124. The rotor 124 is attached to the center beam 116 of each of the moveable comb drive members 113 of the first and second comb drive assemblies 110a and 110b. Therefore, when electrically energized, the first and second comb drive assemblies 110a and 110b contribute electrostatic force in the same direction of motion such that the moveable comb drive fingers 118a and 118b of both the first and second comb drive assemblies 110a and 110b simultaneously move towards the respective fixed comb drive fingers 114a and 114b of the first and second comb drive assemblies 110a and 110b. Springs 122 are coupled to the rotor 124 to enable the linear motion of the rotor 124 in response to the electrostatic forces produced by each of the comb drive assemblies 110a and 110b. In addition, the springs 122 enable the rotor 124 to spring back to an initial position when a voltage is no longer present across the comb drive assemblies 110a and 110b. Although not shown, anchors secure the springs 122 to the substrate.

Figure 4:
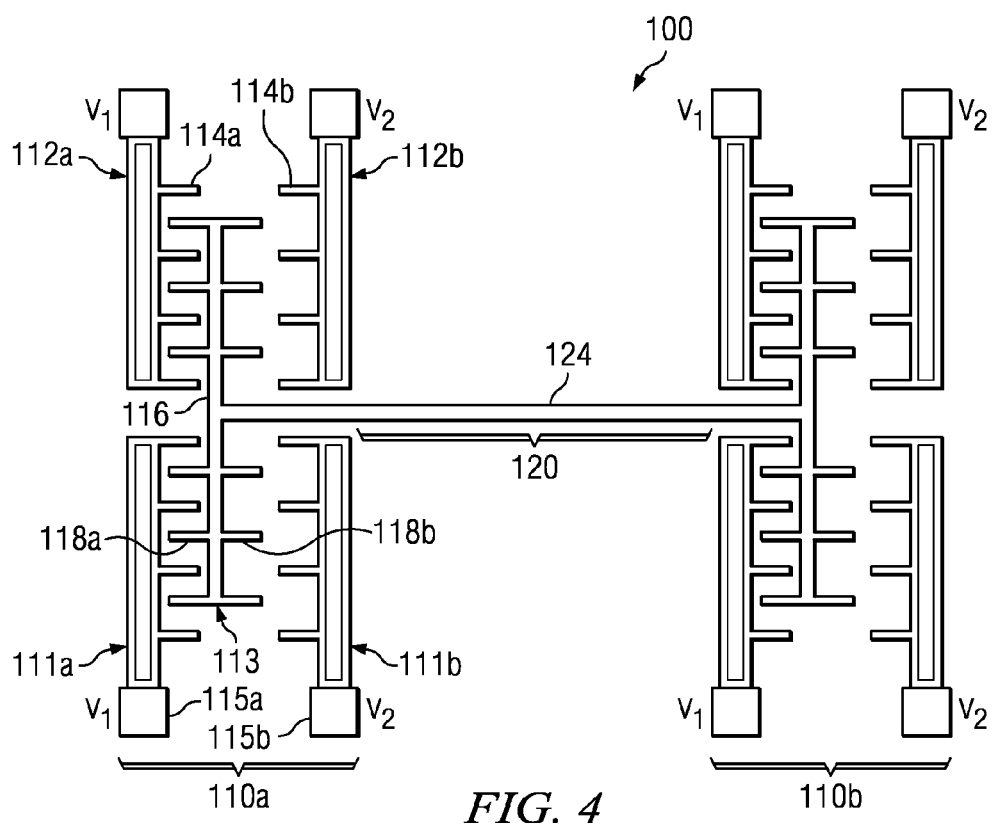
FIGS. 4 and 5 illustrate motion of the electrostatic comb-drive MEMS actuator of FIG. 3.
Figure 5:
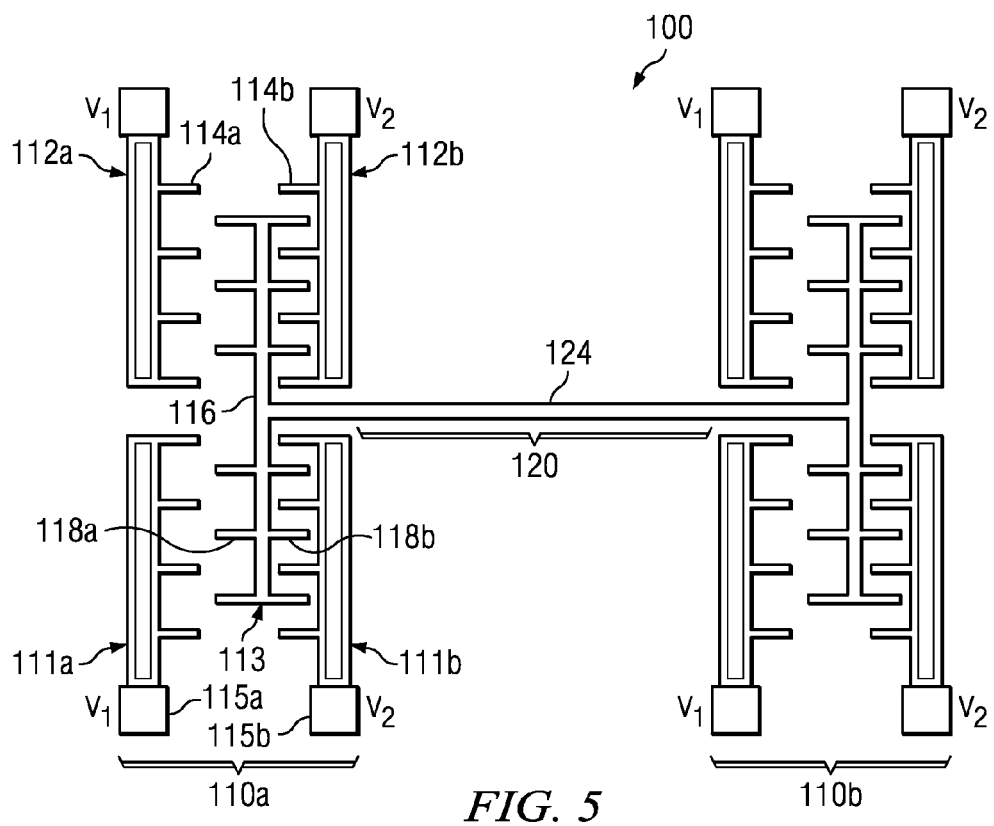

Turning now to FIGS. 4 and 5, the push-pull operation of the bi-directional electrostatic comb drive actuator 100 is shown. As shown in FIG. 4, when there is an actuation on the first fixed comb drive member 111a of each of the first and second comb drive assemblies 110a and 110b (i.e., V1 is on and V2 is off), the first fixed comb drive fingers 114a and the juxtaposed moveable comb drive fingers 118a on that side become interdigitated while the second fixed comb drive fingers 114b and the moveable comb drive fingers 118b on the other side of each of the first and second comb drive assemblies are not overlapping. In this embodiment, the rotor's 124 linear motion is in the direction of the first comb drive assembly 110a.

Likewise, as shown in FIG. 5, when there is an actuation on the second fixed comb drive member 111b of each of the first and second comb drive assemblies 110a and 11b (i.e., V2 is on and V1 is off), the second fixed comb drive fingers 114b and the juxtaposed moveable comb drive fingers 118b on that side become interdigitated while the first fixed comb drive fingers 114a and the moveable comb drive fingers 118a on the other side are not overlapping. In this embodiment, the rotor's 124 linear motion is in the direction of the second comb drive assembly 110b. As can be seen, the push-pull configuration effectively doubles the travel range of the comb drive actuator 100, while not affecting the stable travel range since the finger overlap at the initial position is kept to a minimum (i.e. during actuator operation on one side of each of the comb drive assemblies, the fingers of the other side thereof are non-overlapping).

Figure 6:
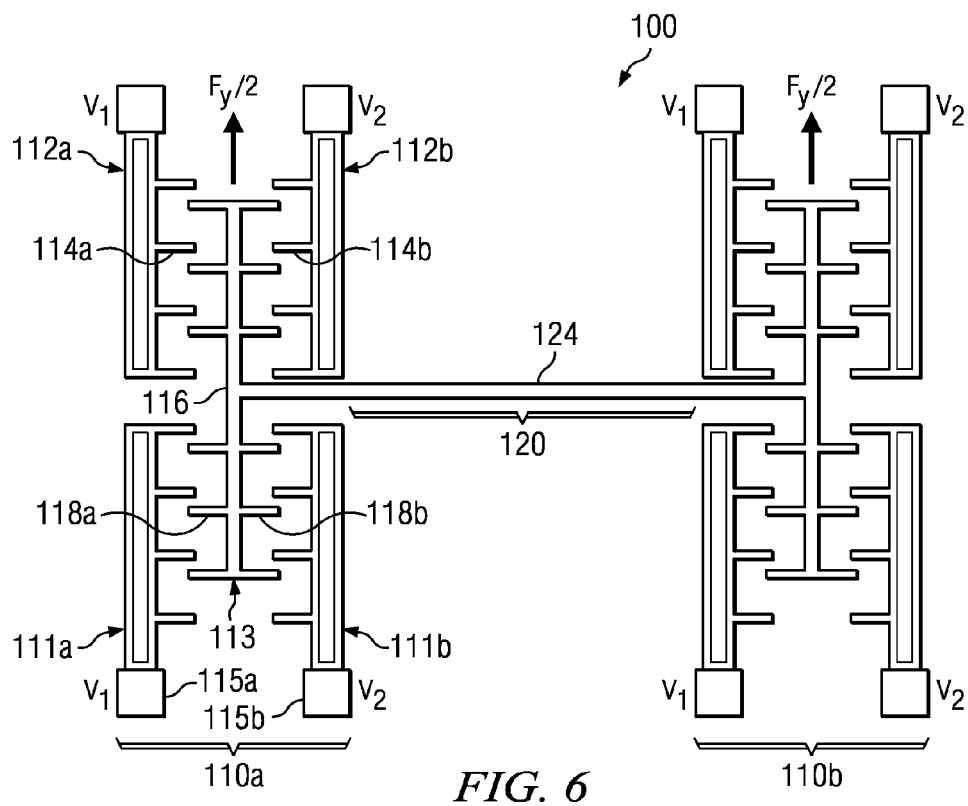
FIG. 6, FIG. 7, FIG. 8a and FIG. 8b illustrate the effect of side force on the electrostatic comb-drive MEMS actuator of FIG. 3.
Figure 7:
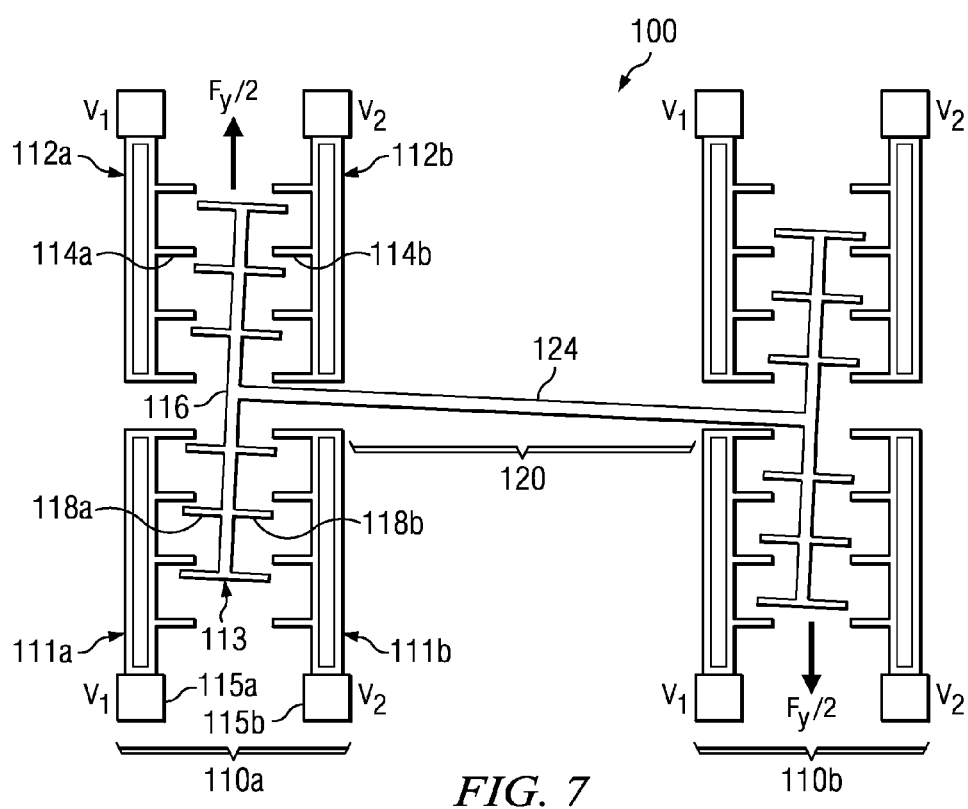

FIGS. 6-8 illustrate the effect of side force on the electrostatic comb-drive MEMS actuator of FIG. 3. In each of FIGS. 6-8, the electrostatic side force $F_y$ is divided between the first and second comb drive assemblies 110a and 110b and the effect of side force $F_Y$ as well as the moment $M_\theta$ for three exemplary cases of $F_y$ is illustrated. As shown in FIG. 6, the side forces $F_y/2$ are acting in the same direction on both of the comb drive assemblies 110a and 110b. In this case, the moment $M_\theta$ around the center of the flexure spring assembly 120 is zero, as each side cancels the moment effect of the other, which leads to an enhancement in the stable travel range. Thus, there is only force $F_y$ to be balanced by the spring 120.

The second case shown in FIG. 7 is similar to the case shown in FIG. 6, except that the forces $F_y/2$ are in opposite directions on each of the comb drive assemblies 110a and 110b. In this case, the moment around the center of the flexure spring assembly 120 is not canceled. However, the displacement in the y-direction is canceled, and only the rotation due to moment $M_\theta$ needs to be balanced by the spring, which in turn enhances the stable range of the comb drive actuator.

Figure 8A:
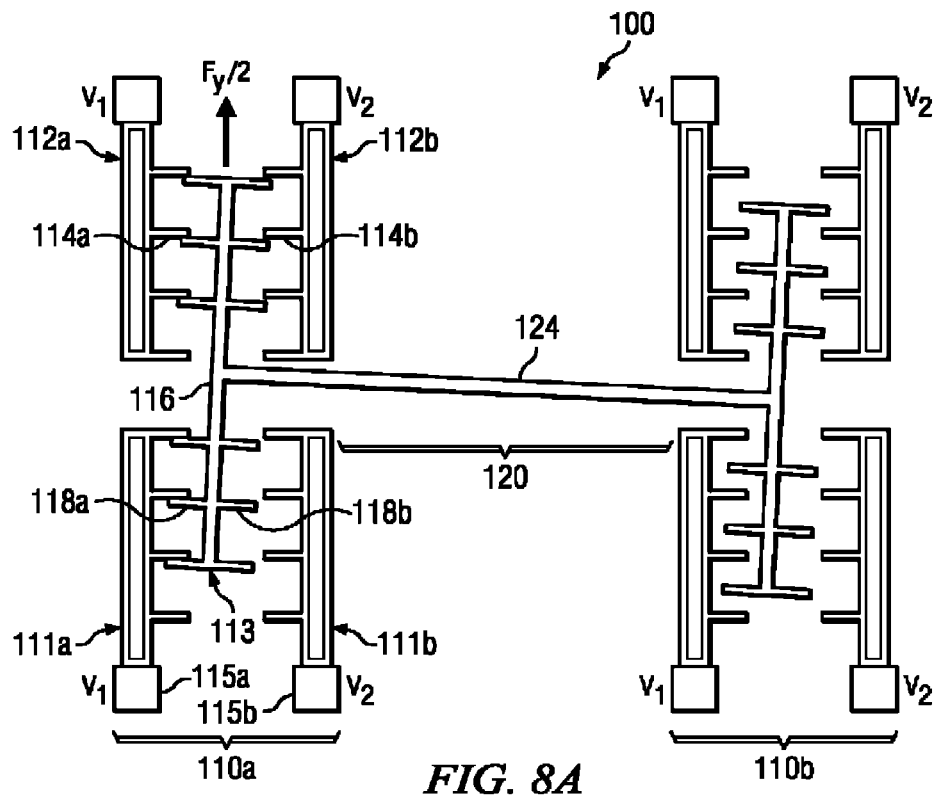
Figure 8B:
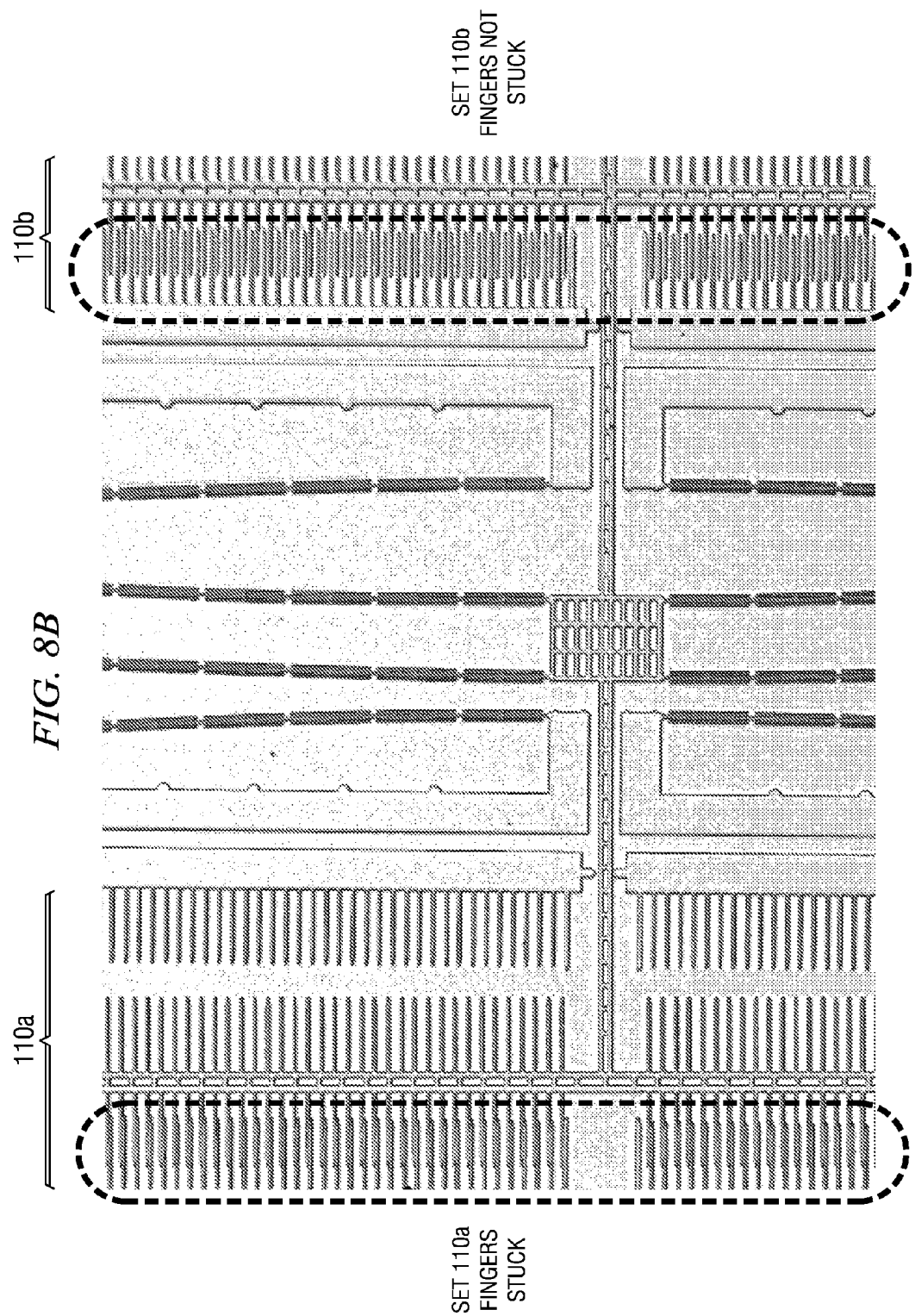

In the third case, as shown in FIG. 8A, there is a force $F_y/2$ on only one of the comb drive assemblies 110a. In this case, there is a translation in the y-direction and a moment, but in only the comb drive assembly 110a where the force is applied. Although the other comb drive assembly 110b may be disturbed, the forces are balanced on the fingers 114a, 114b, 118a and 118b of the other comb drive assembly 110b, and therefore, the fingers 114a, 114b, 118a and 118b of the other comb drive assembly 110b will not stick. This has been verified experimentally, as shown in the optical microscope photograph of FIG. 8B, where it can be seen that when V1 is on for both comb drive assemblies 110a and 110b, the set of pull fingers on the comb drive assembly 110a on the left are sticking while the set of pull fingers on the comb drive assembly 110b on the right are not sticking.

Figure 9:
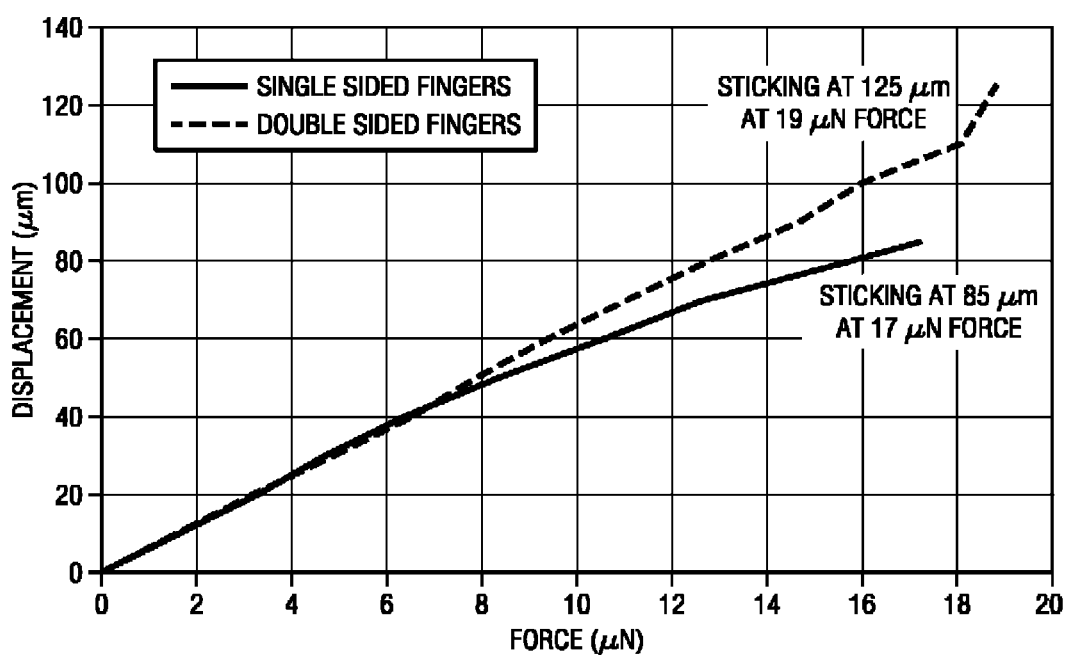
FIG. 9 is a chart illustrating the measured stable travel range of the electrostatic comb-drive MEMS actuator in accordance with embodiments of the present invention.

FIG. 9 is a chart illustrating experimental measurements of the stable travel range of the electrostatic comb-drive MEMS actuator in accordance with embodiments of the present invention. The displacement of a single sided fingers comb-drive actuator (i.e., only one comb drive assembly as shown in FIG. 1) versus the displacement of a double sided comb-drive actuator (i.e., two opposing comb drive assemblies, as shown in FIGS. 2 and 3) is shown. Both actuators have the same dimensions of the spring and comb drive fingers. The comb drive with single sided fingers has stable travel range of about 85 μm, while the comb drive with double sided fingers achieved a stable travel range of 125 μm. This is an extension in the travel range of 47% with the double sided comb-drive actuator as compared to the single sided comb-drive actuator.

Figure 10:
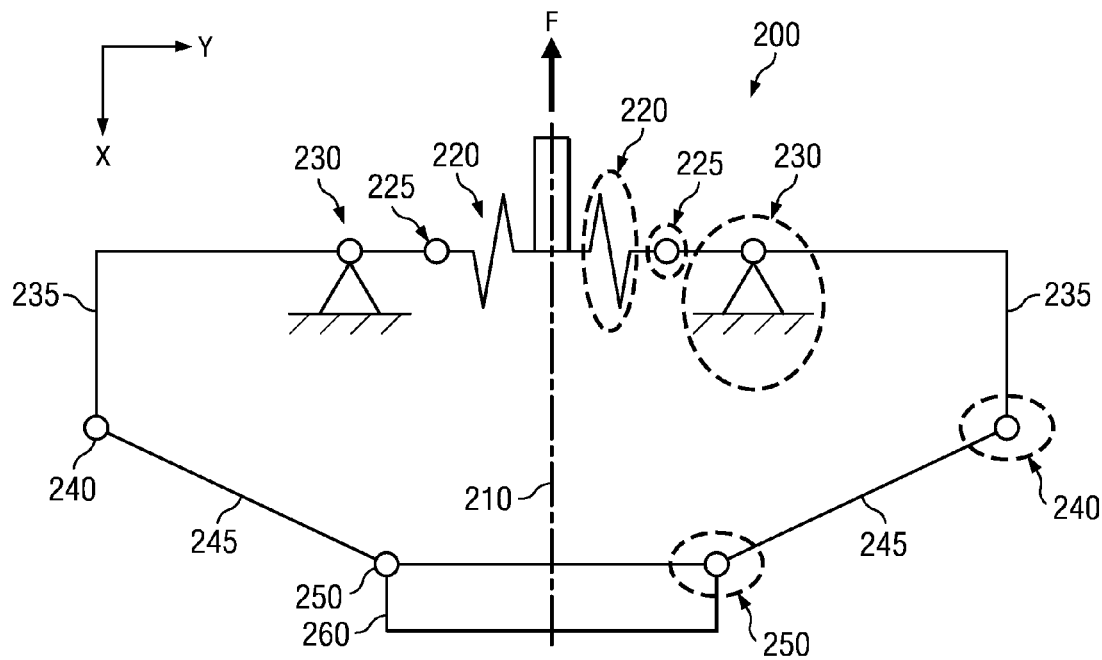
FIG. 10 is a diagram illustrating an exemplary displacement multiplier for use with a MEMS actuator in accordance with embodiments of the present invention.

To further increase the travel range, in addition to using a balanced fingers electrostatic comb-drive actuator, a displacement multiplier 200, as shown in FIG. 10, can also be used. The displacement multiplier 200 operates based on two principles; leverage and classical rotation joints. As is well-known, a lever is a rigid bar that is used with a pivot point to trade off force for displacement. The principle of operation of a lever is simply that the work done at any point on the lever is always the same. Accordingly, the displacement at one end of the lever (D2) is equal to the displacement at the other end of the lever (D1) multiplied by the fractional length on each side of the pivot (L2 and L1) as follows:

$$D_2 = D_1\left(\frac{L_2}{L_1}\right) \quad \text{(Equation 3)}$$

Equation (3) above represents the basic equation for the lever or cantilever displacement multiplication.

The principle of operation of classical joints is to translate motion from an initial direction to the perpendicular direction with amplification in displacement. The displacement amplification (O) produced by the classical rotation joint mechanism is a function of the length (L) of a rigid body between the two rotational joints, the distance (i) traveled in the initial direction by one of the rotational joints and the angle (a) of rotation of the rigid body as a function of the displacement (O) of the other rotational joint, which can be given as:

$$O = \sqrt{L^2 \sin^2 a + i(2L\cos a - i)} - L \sin a \quad \text{(Equation 4)}$$

Since the displacement multiplier 200 shown in FIG. 10 combines a leverage system with a rotational joints system, the overall magnification of the displacement multiplier 200 is thus the multiplication of the ratio $L_2/L_1$ by O.

Turning now to the particulars of the displacement multiplier 200, the displacement multiplier 200 includes a pair of springs 220 symmetrical about a central axis 210 of the displacement multiplier 200 parallel to a direction of a force F applied to the displacement multiplier 200, a pair of spring hinges 225 symmetrical about the central axis 210, a pair of rigid angled beam members 235 symmetrical about the central axis 210, a pair of pivots 230 symmetrical about the central axis, a first pair of hinges 240 symmetrical about the central axis 210, a second pair of hinges 250 symmetrical about the central axis 210 and a pair of rigid body members 245 symmetrical about the central axis 210. A MEMS element 260, such as a micromirror or other moveable component, is coupled between the second pair of hinges 250.

Each of the springs 220 is stiff in the direction of the force F and compliant in a direction perpendicular to the direction of the force, and is coupled to a corresponding one of the pair of spring hinges 225. Each of the angled beam members 235 has a first end coupled to a corresponding one of the pair of spring hinges 225, and a second end coupled to a corresponding one of the first pair of hinges 240. Each of the pivots 230 is coupled to a corresponding one of the pair of angled beam members 235 at a respective pivot point to allow rotation of the pair of angled beam members 235 at spring hinges 225 in response to motion of the pair of springs 220. Each of the rigid body members has a first end coupled to a corresponding one of the first pair of hinges 240 and a second end coupled to a corresponding one of the second pair of hinges 240. The first and second pairs of hinges 240 and 250 allow rotation of the pair of rigid body members 245 in response to motion of the pair of springs 220.

The input displacement of the springs 220 results from applying a mechanical force by a MEMS actuator. In an exemplary embodiment, the MEMS actuator is the electrostatic comb-drive actuator of FIG. 2 or 3. However, in other embodiments, the MEMS actuator could be a different electrical, thermal or magnetic actuator. The displacement multiplier 200 is symmetric around the central axis (or X-axis) 210 to ensure that the input and the output displacements are in the X direction only without any rotation or displacements in the Y direction. The springs 220 isolate the motion in the Y direction and translate the motion in the X direction. Thus, the springs 220 are compliant in the Y direction and stiff in the X direction and are coupled to the angled beam members via spring hinges 225 to allow rotation. The pivots 230 allow only one degree of freedom (i.e., the rotation of the angled beam members 235). The hinges 240 and 250 translate motion and allow rotation of the rigid body members 245.

Figure 11:
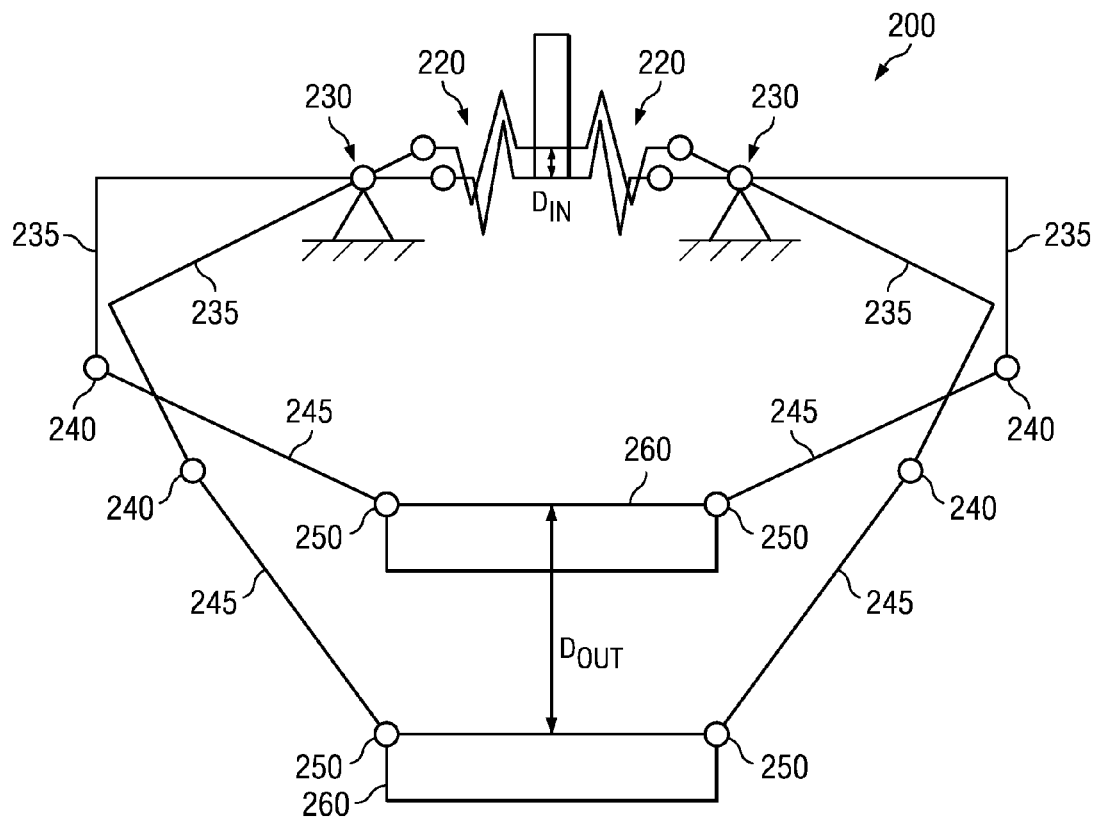
FIG. 11 illustrates motion of the displacement multiplier to cause a displacement of a MEMS element, in accordance with embodiments of the present invention.

For example, as shown in FIG. 11, two exemplary states for the displacement multiplier are illustrated. In the first state, no force has been applied to the displacement multiplier 200 and the position of MEMS element 260 remains unchanged, as in FIG. 10. In the second state, a force is applied to the displacement multiplier 200 to cause rotation of the angled beam members 235 and rigid body members 245 to enable the MEMS element 260 to be displaced. It can be seen in FIG. 11 that a small input displacement $D_{in}$ due to the MEMS actuator is amplified by the displacement amplifier 200, resulting in a large output displacement $D_{out}$.

Figure 12:
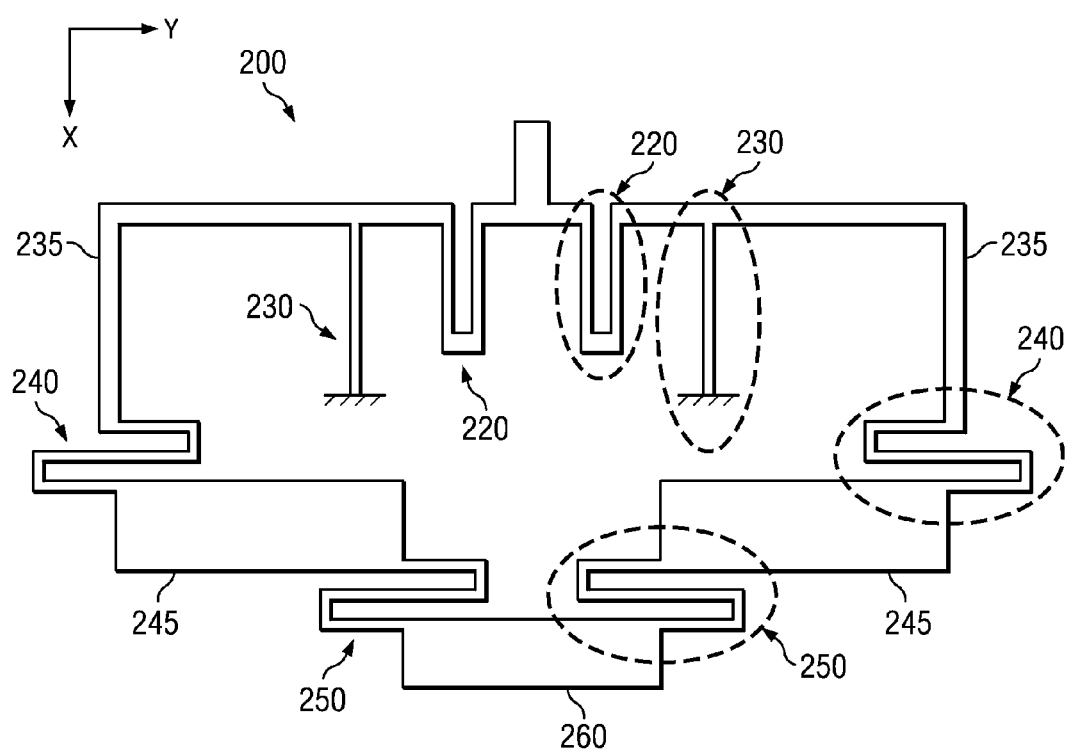
FIG. 12 is a plan view of an exemplary displacement multiplier in accordance with embodiments of the present invention.

Turning now to FIG. 12, to avoid any friction between the different parts of the displacement multiplier 200, the hinges and pivots have been replaced by compliant structures. As shown in FIG. 12, the springs and corresponding spring hinges 220 and 225 have been replaced with compliant structures that each have a U-shaped beam designed to be compliant in the Y direction and stiff in the X direction. Hence, the spring beam 220 parallel to the X-axis is long while the beam parallel to the Y-axis is short. The U-shaped beam 220 also serves as a hinge, and has the advantage of minimizing the structure dimension along X-direction.

The pivots 230 have also replaced with compliant structures. For example, as shown in FIG. 12, simple cantilever beams 230 serve as the pivots. Although the ideal pivot allows for rotation without displacement (i.e., only one degree of freedom), while the cantilever beam allows for displacement and rotation, the cantilever beam performs more efficiently than the ideal pivot. In FIG. 12, any displacement from the cantilever beam in the X direction will be translated additively to the output displacement, which will increase the displacement multiplication of the MEMS element 260. On the other hand, any displacement of the cantilever beam in the Y direction will be transformed and multiplied by the classical rotation joints to a displacement in the X-direction, which adds to the output displacement and increases the displacement multiplication of the MEMS element 260.

The hinges 240 and 250 have been replaced with compliant structures that have S-shaped beams that are stiff in both the X and Y directions to translate motion. In addition, the S-shaped beams 240 and 250 are compliant in the rotational direction to perform as ideal hinges. Accordingly, there is a tradeoff in the design of the S-shaped hinges to achieve optimal performance.

Figure 13:
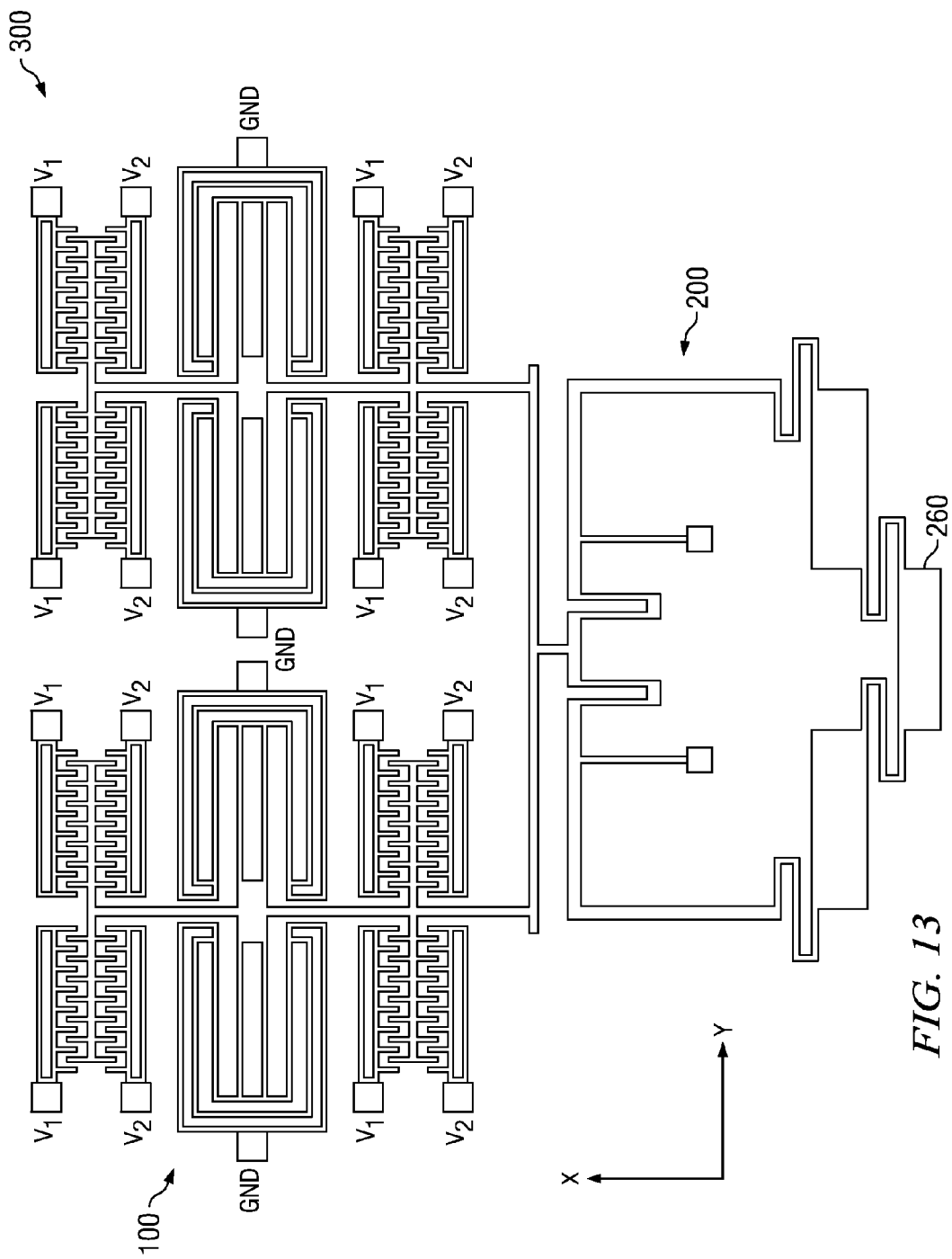
FIG. 13 is a plan view of an exemplary MEMS device including an exemplary electrostatic comb-drive actuator and exemplary displacement multiplier in accordance with embodiments of the present invention.

FIG. 13 illustrates an exemplary MEMS device 300 including an exemplary electrostatic comb-drive actuator 100 and exemplary displacement multiplier 200 in accordance with embodiments of the present invention. When the displacement multiplier 200 is used with the electrostatic comb-drive actuator 100, the total travel range can be extended for small displacements of the actuator 100. In addition, by utilizing two or more comb-drive actuators, the driving voltage necessary for driving each comb-drive actuator is reduced.

In FIG. 13, two electrostatic comb-drive actuators 100 are used to drive the displacement multiplier 200, which can further increase the side stability. For example, if the stiffness in the X-direction from the displacement multiplier 200 is $K_{multiplier}$ and there are two electrostatic comb-drive actuators, $K_{multiplier}$ will be divided equally between the two actuators 100. Therefore, when considering the side stability of the comb-drive actuators, a stiffness of half $K_{multiplier}$ is added to each of the actuators. As such, using two electrostatic comb-drive actuators rather than one divides the loading effect from the stiffness in the X direction of the displacement multiplier 200 onto the two actuators 100. By dividing $K_{multiplier}$ in half, the total stiffness in the X direction decreases.

For example, the total stiffness in the X direction using only one comb-drive actuator can be estimated as:

$$K_{total} = K_x + K_{multiplier}, \quad \text{(Equation 5)}$$

where $K_x$ is the stiffness of the spring of the electrostatic comb-drive actuator in the X direction. Therefore, the total stiffness in the X direction using two comb-drive actuators with two springs is:

$$Kx_{total} = K_x + \frac{K_{multiplier}}{2}. \quad \text{(Equation 6)}$$

Thus, decreasing stiffness in the x direction increases side stability; which results in a longer travel range. More particularly, when the ratio between the total spring constant stiffness in the Y and X directions (Ky/Kx) is increased, a longer stable travel range of the comb-drive actuator is produced. Since the displacement multiplier 200 has a low stiffness in the Y-direction, reducing the X-stiffness share for each comb-drive actuator 100 ensures a long travel range.

Figure 14:
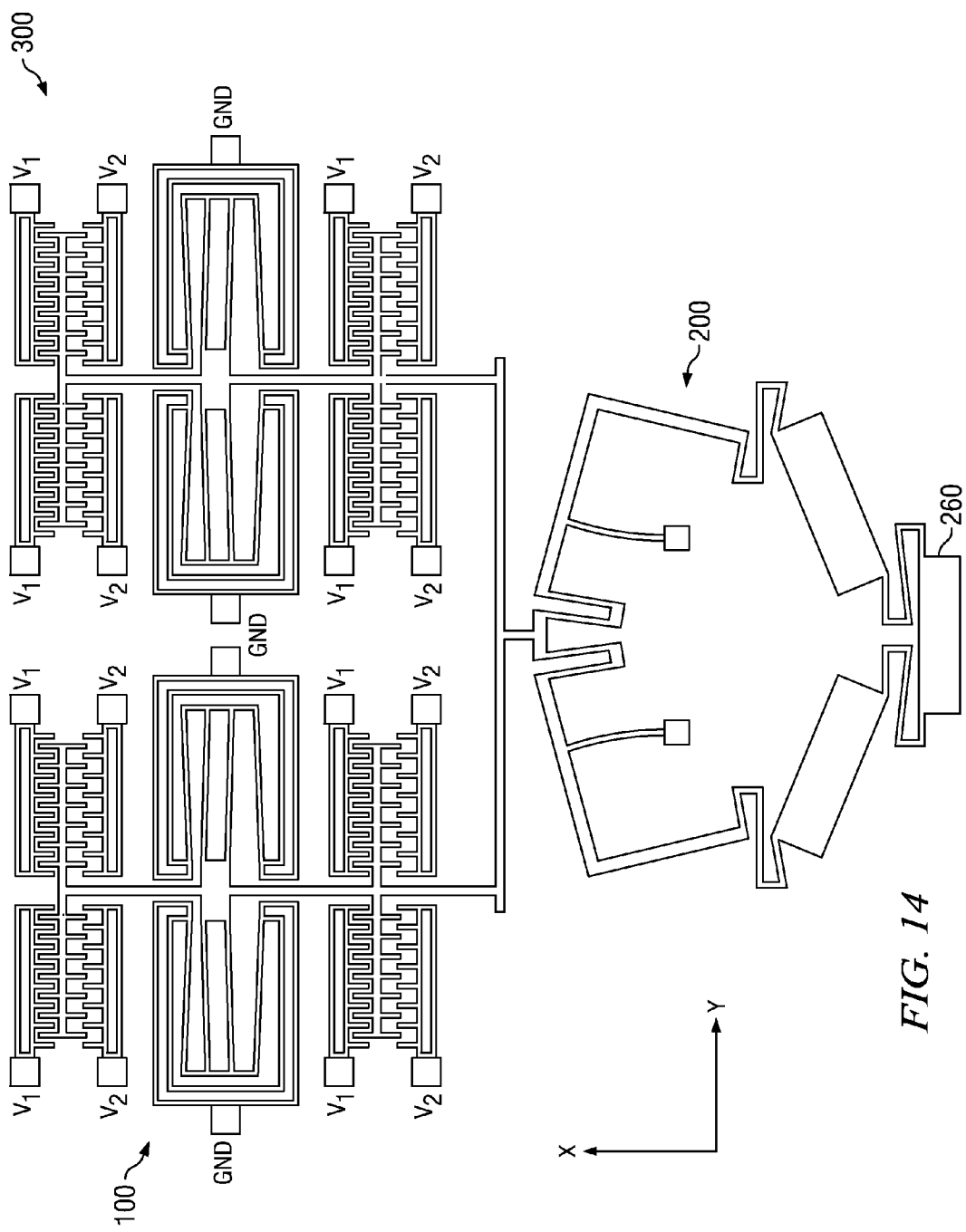
FIG. 14 illustrates exemplary motion of the MEMS device in accordance with embodiments of the present invention.

FIG. 14 illustrates exemplary motion of the MEMS device 300 in accordance with embodiments of the present invention. As can be seen in FIG. 14, by combining the balanced fingers comb-drive actuator 100 shown in FIG. 3 and the displacement multiplier shown in FIG. 12, larger displacements of the MEMS element 260 can be achieved. The magnification factor of the displacement multiplier 200 may be adjusted to achieve an order of magnitude increase in the displacement.

As will be recognized by those skilled in the art, the innovative concepts described in the present application can be modified and varied over a wide range of applications. Accordingly, the scope of patents subject matter should not be limited to any of the specific exemplary teachings discussed, but is instead defined by the following claims.

We claim:

1. An electrostatic comb drive actuator for a Micro Electro-Mechanical System (MEMS) device, comprising:
 a flexure spring assembly; and
 first and second comb drive assemblies, each coupled to the flexure spring assembly on opposing sides thereof, each of the first and second comb assemblies including:
  a fixed comb drive member having an elongate member with comb drive fingers extending from one side thereof; and
  a moveable comb drive member having a center beam coupled to the flexure spring assembly and comb drive fingers extending from one side of the center beam towards the comb drive fingers of the fixed comb drive member;
 wherein the moveable comb drive member is moveable between a first position in which the comb drive fingers of the moveable comb drive member and the fixed comb drive member are partially overlapped and a second position in which the comb drive fingers of the moveable comb drive member and the fixed comb drive member are interdigitated to cause a displacement of the flexure spring assembly;
 wherein the comb drive fingers are divided equally between the first and second comb drive assemblies and placed symmetrically about a symmetry axis of the flexure spring assembly perpendicular to a direction of motion of the moveable comb drive member; and
 wherein the first and second comb drive assemblies when electrically energized contribute electrostatic force in the same direction of motion such that the comb drive fingers of the moveable comb drive members of both the first and second comb drive assemblies simultaneously move towards the comb drive fingers of the respective fixed comb drive members of the first and second comb drive assemblies.

2. The electrostatic comb drive actuator of claim 1, wherein each of the first and second comb drive assemblies further includes:
 first and second fixed comb drive members, each of the first and second comb drive members having a respective elongate member with respective comb drive fingers extending from one side thereof; and
 the moveable comb drive member includes two sets of comb drive fingers extending in opposite directions from the center beam towards the comb drive fingers of each of the first and second fixed comb drive members;
 wherein the moveable comb drive member is moveable between the first position in which the comb drive fingers of the moveable comb drive member, the first fixed comb drive member and the second fixed comb drive member are partially overlapped, the second position in which the comb drive fingers of the first fixed comb drive member and one of the sets of the moveable comb drive member are interdigitated and a third position in which the comb drive fingers of the second fixed comb drive member and the other of the sets of the moveable comb drive member are interdigitated.

3. The electrostatic comb drive actuator of claim 2, wherein, in the second position, there is no overlap between the comb drive fingers of the second fixed comb drive member and the moveable comb drive member.

4. The electrostatic comb drive actuator of claim 2, wherein, in the third position, there is no overlap between the comb drive fingers of the first fixed comb drive member and the moveable comb drive member.

5. The electrostatic comb drive actuator of claim 1, wherein a moment around a center of the flexure spring assembly is canceled when an electrostatic force perpendicular to the direction of motion of the moveable comb drive member on each of the first and second comb drive assemblies is in a same direction.

6. The electrostatic comb drive actuator of claim 5, wherein a displacement of the comb drive fingers of the moveable comb drive member in the direction perpendicular to the direction of motion of the moveable comb drive member is canceled when the electrostatic force on each of the first and second comb drive assemblies is in opposite directions.

7. The electrostatic comb drive actuator of claim 5, wherein a displacement of the comb drive fingers of the moveable comb drive member in the direction perpendicular to the direction of motion of the moveable comb drive member is minimized on the first comb drive assembly when the electrostatic force on the second comb drive assembly is greater than the electrostatic force on the first comb drive assembly.

8. A Micro Electro-Mechanical System (MEMS) device, comprising:
an electrostatic comb drive actuator including:
a flexure spring assembly; and
first and second comb drive assemblies, each coupled to the flexure spring assembly on opposing sides thereof, each of the first and second comb assemblies including:
a fixed comb drive member having an elongate member with comb drive fingers extending from one side thereof; and
a moveable comb drive member having a center beam coupled to the flexure spring assembly and comb drive fingers extending from one side of the center beam towards the comb drive fingers of the fixed comb drive member;
wherein the moveable comb drive member is moveable between a first position in which the comb drive fingers of the moveable comb drive member and the fixed comb drive member are partially overlapped and a second position in which the comb drive fingers of the moveable comb drive member and the fixed comb drive member are interdigitated to cause a displacement of the flexure spring member;
wherein the comb drive fingers are divided equally between the first and second comb drive assemblies and placed symmetrically about a symmetry axis of the flexure spring assembly perpendicular to a direction of motion of the moveable comb drive member; and
wherein the first and second comb drive assemblies when electrically energized contribute electrostatic force in the same direction of motion such that the comb drive fingers of the moveable comb drive members of both the first and second comb drive assemblies simultaneously move towards the comb drive fingers of the respective fixed comb drive members of the first and second comb drive assemblies;
a displacement multiplier coupled to the flexure spring assembly of the electrostatic comb drive actuator, the displacement multiplier including:
a pair of springs symmetrical about a central axis of the displacement multiplier parallel to a direction of force applied by the electrostatic comb drive actuator to the displacement multiplier as a result of the displacement of the flexure spring assembly, each of the springs being stiff in the direction of the force and compliant in a direction perpendicular to the direction of the force;
a pair of angled beam members symmetrical about the central axis and each having a first end coupled to a corresponding one of the pair of springs;
a pair of pivots symmetrical about the central axis and each coupled to a corresponding one of the pair of angled beam members at a respective pivot point to allow rotation of the pair of angled beam members in response to motion of the pair of springs;
a first pair of hinges symmetrical about the central axis and each coupled to a second end of a corresponding one of the pair of angled beam members;
a pair of rigid body members symmetrical about the central axis and each having a first end coupled to a corresponding one of the first pair of hinges; and
a second pair of hinges symmetrical about the central axis and each coupled to a second end of a corresponding one of the pair of rigid body members, the first and second pairs of hinges allowing rotation of the pair of rigid body members in response to motion of the pair of springs; and
a MEMS moveable element coupled between the second pair of hinges;
wherein the force applied by the electrostatic comb drive actuator on the displacement multiplier causes an amplified displacement of the MEMS moveable element with respect to the displacement of the flexure spring assembly.

9. The MEMS device of claim 8, wherein each of the first and second comb drive assemblies further includes:
first and second fixed comb drive members, each of the first and second comb drive members having a respective elongate member with respective comb drive fingers extending from one side thereof; and
the moveable comb drive member includes two sets of comb drive fingers extending in opposite directions from the center beam towards the comb drive fingers of each of the first and second fixed comb drive members;
wherein the moveable comb drive member is moveable between the first position in which the comb drive fingers of the moveable comb drive member, the first comb drive member and the second comb drive member are partially overlapped, the second position in which the comb drive fingers of the first fixed comb drive member and one of the sets of the moveable comb drive member are interdigitated and a third position in which the comb drive fingers of the second fixed comb drive member and the other of the sets of the moveable comb drive member are interdigitated.

10. The MEMS device of claim 9, wherein in the second position, there is no overlap between the comb drive fingers of the second fixed comb drive member and the moveable comb drive member.

11. The MEMS device of claim 9, wherein, in the third position, there is no overlap between the comb drive fingers of the first fixed comb drive member and the moveable comb drive member.

12. The MEMS device of claim 8, wherein each of the springs is a compliant structure forming a V-shaped beam.

13. The MEMS device of claim 8, wherein each of the pivots is a compliant structure forming a cantilever beam.

14. The MEMS device of claim 8, wherein each of the hinges is a compliant structure forming an S-shape beam.

15. The MEMS device of claim 8, wherein corresponding ones of the first and second pair of hinges and the corresponding rigid body member therebetween form respective rotational joint systems in which motion in a direction perpendicular to the direction of motion of the electrostatic comb-drive actuator is magnified and transformed to the direction of motion of the MEMS element.

16. The MEMS device of claim 15, wherein corresponding ones of the pair of springs, the pair of pivots and the pair of angled beam members form respective lever systems, wherein the lever systems and the rotational joint systems are placed symmetrically around the symmetrical axis to transform rotation motion into translational motion corresponding to the direction of motion of the MEMS element.

17. The MEMS device of claim 8, further comprising:
at least one additional electrostatic comb-drive actuator coupled to the displacement multiplier.

18. A displacement multiplier for use within a Micro Electro-Mechanical System (MEMS) device, comprising:
a pair of springs symmetrical about a central axis of the displacement multiplier parallel to a direction of a force applied to the displacement multiplier, each of the springs being stiff in the direction of the force and compliant in a direction perpendicular to the direction of the force;

a pair of angled beam members symmetrical about the central axis and each having a first end coupled to a corresponding one of the pair of springs;

a pair of pivots symmetrical about the central axis and each coupled to a corresponding one of the pair of angled beam members at a respective pivot point to allow rotation of the pair of angled beam members in response to motion of the pair of springs;

a first pair of hinges symmetrical about the central axis and each coupled to a second end of a corresponding one of the pair of angled beam members;

a pair of rigid body members symmetrical about the central axis and each having a first end coupled to a corresponding one of the first pair of hinges; and a second pair of hinges symmetrical about the central axis and each coupled to a second end of a corresponding one of the pair of rigid body members, the first and second pairs of hinges allowing rotation of the pair of rigid body members in response to motion of the pair of springs.

19. The displacement multiplier of claim 18, wherein each of the springs is a compliant structure forming a U-shaped beam.

20. The displacement multiplier of claim 18, wherein each of the pivots is a compliant structure forming a cantilever beam.

21. The displacement multiplier of claim 18, wherein each of the hinges is a compliant structure forming an S-shape beam.

22. The displacement multiplier of claim 18, wherein corresponding ones of the pair of springs, the pair of angled beam members and the pair of pivots form respective leverage mechanisms that magnify an input displacement associated with the force applied to the displacement multiplier.

23. The displacement multiplier of claim 18, wherein corresponding ones of the first and second pair of hinges and the corresponding rigid body member therebetween form respective rotational joint systems in which motion in a direction perpendicular to the direction of motion of the electrostatic comb-drive actuator is magnified and transformed to a direction of motion of a MEMS element coupled between the second pair of hinges.

24. The displacement multiplier of claim 23, wherein corresponding ones of the pair of springs, the pair of pivots and the pair of angled beam members form respective lever systems, wherein the lever systems and the rotational joint systems are placed symmetrically around the symmetrical axis to transform rotation motion into translational motion corresponding to the direction of motion of the MEMS element.

* * * * *